(12) United States Patent
Woychik et al.

(10) Patent No.: US 10,381,326 B2
(45) Date of Patent: Aug. 13, 2019

(54) STRUCTURE AND METHOD FOR INTEGRATED CIRCUITS PACKAGING WITH INCREASED DENSITY

(71) Applicant: Invensas Corporation, San Jose, CA (US)

(72) Inventors: Charles G. Woychik, San Jose, CA (US); Arkalgud R. Sitaram, Cupertino, CA (US); Andrew Cao, Fremont, CA (US); Bong-Sub Lee, Mountain View, CA (US)

(73) Assignee: Invensas Corporation, San Jose, CA (US)

( * ) Notice: Subject to any disclaimer, the term of this patent is extended or adjusted under 35 U.S.C. 154(b) by 150 days.

(21) Appl. No.: 14/289,483

(22) Filed: May 28, 2014

(65) Prior Publication Data

US 2015/0348940 A1   Dec. 3, 2015

(51) Int. Cl.
*H01L 25/065* (2006.01)
*H01L 23/00* (2006.01)
(Continued)

(52) U.S. Cl.
CPC .......... *H01L 25/0657* (2013.01); *H01L 21/56* (2013.01); *H01L 21/561* (2013.01);
(Continued)

(58) Field of Classification Search
CPC .......... H01L 27/11206; H01L 23/5252; H01L 29/4236; H01L 2225/06506;
(Continued)

(56) References Cited

U.S. PATENT DOCUMENTS 2,230,663 A    2/1941 Alden
3,289,452 A   12/1966 Koellner
(Continued)

FOREIGN PATENT DOCUMENTS

CN   1352804 A   6/2002
CN   1641832 A   7/2005
(Continued)

OTHER PUBLICATIONS

International Search Report and Written Opinion in corresponding International Application No. PCT/US2015/032679, dated Nov. 11, 2015.
(Continued)

*Primary Examiner* — William F Kraig
*Assistant Examiner* — Khatib A Rahman

(57) ABSTRACT

A method of forming a semiconductor package comprises forming one or more first vias in a first side of a substrate and attaching a first side of a first microelectronic element to the first side of the substrate. The first microelectronic element is electrically coupled to at least one of the one or more first vias. The method further comprise obtaining a second microelectronic element including one or more second vias in a first side of the second microelectronic element, and attaching a second side of the substrate to the first side of the second microelectronic element. The second microelectronic element is electrically coupled to at least one of the one or more first vias. Each of one or more connecting elements has a first end attached to a first side of the second microelectronic element and a second end extends beyond a second side of the first microelectronic element.

5 Claims, 11 Drawing Sheets

Sequential stacking assembly (i=1,2,...n)

(51) Int. Cl.
  *H01L 25/00* (2006.01)
  *H01L 21/768* (2006.01)
  *H01L 21/56* (2006.01)
  *H01L 23/373* (2006.01)
  *H01L 23/367* (2006.01)
  *H01L 23/29* (2006.01)
  *H01L 23/31* (2006.01)
  *H01L 23/48* (2006.01)
  *H01L 21/683* (2006.01)
  *H01L 25/03* (2006.01)
  *H01L 25/18* (2006.01)

(52) U.S. Cl.
  CPC .... *H01L 21/6835* (2013.01); *H01L 21/76898* (2013.01); *H01L 23/29* (2013.01); *H01L 23/3107* (2013.01); *H01L 23/3128* (2013.01); *H01L 23/367* (2013.01); *H01L 23/3731* (2013.01); *H01L 23/481* (2013.01); *H01L 24/02* (2013.01); *H01L 24/13* (2013.01); *H01L 24/14* (2013.01); *H01L 24/17* (2013.01); *H01L 24/92* (2013.01); *H01L 24/94* (2013.01); *H01L 24/97* (2013.01); *H01L 25/03* (2013.01); *H01L 25/0652* (2013.01); *H01L 25/18* (2013.01); *H01L 25/50* (2013.01); *H01L 21/563* (2013.01); *H01L 23/295* (2013.01); *H01L 24/81* (2013.01); *H01L 2221/68327* (2013.01); *H01L 2221/68331* (2013.01); *H01L 2224/0231* (2013.01); *H01L 2224/02372* (2013.01); *H01L 2224/0401* (2013.01); *H01L 2224/05568* (2013.01); *H01L 2224/05573* (2013.01); *H01L 2224/05611* (2013.01); *H01L 2224/05647* (2013.01); *H01L 2224/05655* (2013.01); *H01L 2224/05664* (2013.01); *H01L 2224/131* (2013.01); *H01L 2224/13022* (2013.01); *H01L 2224/13109* (2013.01); *H01L 2224/13111* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/13193* (2013.01); *H01L 2224/14155* (2013.01); *H01L 2224/14181* (2013.01); *H01L 2224/16145* (2013.01); *H01L 2224/16146* (2013.01); *H01L 2224/16235* (2013.01); *H01L 2224/1703* (2013.01); *H01L 2224/17051* (2013.01); *H01L 2224/17181* (2013.01); *H01L 2224/2919* (2013.01); *H01L 2224/2929* (2013.01); *H01L 2224/29388* (2013.01); *H01L 2224/32145* (2013.01); *H01L 2224/32225* (2013.01); *H01L 2224/73104* (2013.01); *H01L 2224/73204* (2013.01); *H01L 2224/92125* (2013.01); *H01L 2224/94* (2013.01); *H01L 2224/97* (2013.01); *H01L 2225/06513* (2013.01); *H01L 2225/06541* (2013.01); *H01L 2225/06568* (2013.01); *H01L 2225/06589* (2013.01); *H01L 2924/15311* (2013.01); *H01L 2924/18161* (2013.01)

(58) Field of Classification Search
  CPC . H01L 2225/06517; H01L 2225/06541; H01L 2225/06548; H01L 2225/06572; H01L 2224/16235; H01L 2224/48141; H01L 23/5384; H01L 25/0657; H01L 24/97; H01L 21/56; H01L 24/14
  See application file for complete search history.

(56) References Cited

U.S. PATENT DOCUMENTS

| | | |
|---|---|---|
| 3,358,897 A | 12/1967 | Christensen |
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,867,267 A | 9/1989 | Carlson |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |
| 4,975,079 A | 12/1990 | Beaman et al. |
| 4,982,265 A | 1/1991 | Watanabe et al. |
| 4,998,885 A | 3/1991 | Beaman et al. |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | DiFrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,454 A | 8/1993 | Ameen et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,476,211 A | 12/1995 | Khandros |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,578,869 A | 11/1996 | Hoffman et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |

(56) References Cited

U.S. PATENT DOCUMENTS

| | | |
|---|---|---|
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,874,781 A | 2/1999 | Fogal et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,977,640 A | 11/1999 | Bertin et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,180,881 B1 | 1/2001 | Isaak |
| 6,188,965 B1 | 1/2001 | Malinovich et al. |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 * | 5/2002 | Krassowski ............ H01B 1/24 |
| | | 205/125 |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,472,743 B2 | 10/2002 | Huang et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,550,666 B2 | 2/2003 | Chew et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,555,918 B2 | 4/2003 | Masuda et al. |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2 | 2/2004 | Farnworth et al. |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2 | 4/2004 | Satoh et al. |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,741,085 B1 | 5/2004 | Khandros et al. |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,317 B2 | 8/2004 | Fjelstad |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,780,746 B2 | 8/2004 | Kinsman et al. |
| 6,787,926 B2 | 9/2004 | Chen et al. |
| 6,790,757 B1 | 9/2004 | Chittipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |

(56) References Cited

U.S. PATENT DOCUMENTS

| | | |
|---|---|---|
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,908,785 B2 | 6/2005 | Kim |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,785 B2 | 10/2007 | Bauer et al. |
| 7,276,799 B2 | 10/2007 | Lee et al. |
| 7,287,322 B2 | 10/2007 | Mahieu et al. |
| 7,290,448 B2 | 11/2007 | Shirasaka et al. |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 4/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,378,726 B2 | 5/2008 | Punzalan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,485,969 B2 | 2/2009 | Corisis et al. |
| 7,495,179 B2 | 2/2009 | Kubota et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,528,474 B2 | 5/2009 | Lee |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,560,360 B2 | 7/2009 | Cheng et al. |
| 7,564,116 B2 | 7/2009 | Ahn et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,595,548 B2 | 9/2009 | Shirasaka et al. |
| 7,605,479 B2 | 10/2009 | Mohammed |
| 7,612,638 B2 | 11/2009 | Chung et al. |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,670,940 B2 | 3/2010 | Mizukoshi et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,960 B2 | 3/2010 | Wen |
| 7,682,962 B2 | 3/2010 | Hembree |
| 7,683,460 B2 | 3/2010 | Heitzer et al. |
| 7,683,482 B2 | 3/2010 | Nishida et al. |
| 7,692,931 B2 | 4/2010 | Chong et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |

(56) References Cited

U.S. PATENT DOCUMENTS

| | | |
|---|---|---|
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,800,233 B2 | 9/2010 | Kawano et al. |
| 7,807,512 B2 | 10/2010 | Lee et al. |
| 7,808,093 B2 | 10/2010 | Kagaya et al. |
| 7,808,439 B2 | 10/2010 | Yang et al. |
| 7,815,323 B2 | 10/2010 | Saeki |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,876,180 B2 | 1/2011 | Uchimura |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,910,385 B2 | 3/2011 | Kweon et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 | 9/2011 | Moriya |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |
| 8,174,119 B2 | 5/2012 | Pendse |
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,237,257 B2 | 8/2012 | Yang |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,315,060 B2 | 11/2012 | Morikita et al. |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,354,297 B2 | 1/2013 | Pagaila et al. |
| 8,362,620 B2 | 1/2013 | Pagani |
| 8,372,741 B1 * | 2/2013 | Co .......................... H01L 24/03 438/617 |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,492,201 B2 | 7/2013 | Pagaila et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,567,051 B2 | 10/2013 | Val |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 * | 12/2013 | Sato .................... H01L 23/3121 257/737 |
| 8,624,374 B2 | 1/2014 | Ding et al. |
| 8,633,059 B2 | 1/2014 | Do et al. |
| 8,637,991 B2 | 1/2014 | Haba |

(56) References Cited

U.S. PATENT DOCUMENTS

| | | |
|---|---|---|
| 8,646,508 B2 | 2/2014 | Kawada |
| 8,653,626 B2 | 2/2014 | Lo et al. |
| 8,653,668 B2 | 2/2014 | Uno et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,670,261 B2 | 3/2014 | Crisp et al. |
| 8,680,662 B2 | 3/2014 | Haba et al. |
| 8,680,677 B2 * | 3/2014 | Wyland .................. H01L 24/81 257/690 |
| 8,680,684 B2 | 3/2014 | Haba et al. |
| 8,685,792 B2 | 4/2014 | Chow et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,766,436 B2 | 7/2014 | Delucca et al. |
| 8,772,152 B2 | 7/2014 | Co et al. |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,135 B2 | 8/2014 | Oganesian et al. |
| 8,796,846 B2 | 8/2014 | Lin et al. |
| 8,810,031 B2 | 8/2014 | Chang et al. |
| 8,811,055 B2 | 8/2014 | Yoon |
| 8,816,505 B2 | 8/2014 | Mohammed et al. |
| 8,835,228 B2 | 9/2014 | Mohammed |
| 8,836,136 B2 | 9/2014 | Chau et al. |
| 8,836,140 B2 | 9/2014 | Ma et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 | 11/2014 | Haba et al. |
| 8,884,416 B2 | 11/2014 | Lee et al. |
| 8,893,380 B2 | 11/2014 | Kim et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,923,004 B2 | 12/2014 | Low et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,948,712 B2 | 2/2015 | Chen et al. |
| 8,963,339 B2 | 2/2015 | He et al. |
| 8,970,049 B2 | 3/2015 | Karnezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,128,123 B2 | 9/2015 | Liu et al. |
| 9,136,254 B2 | 9/2015 | Zhao et al. |
| 9,142,586 B2 | 9/2015 | Wang et al. |
| 9,153,562 B2 | 10/2015 | Haba et al. |
| 9,167,710 B2 | 10/2015 | Mohammed et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,209,081 B2 | 12/2015 | Lim et al. |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,263,413 B2 | 2/2016 | Mohammed |
| 9,299,670 B2 | 3/2016 | Yap et al. |
| 9,318,449 B2 | 4/2016 | Hasch et al. |
| 9,318,452 B2 | 4/2016 | Chen et al. |
| 9,324,696 B2 | 4/2016 | Choi et al. |
| 9,330,945 B2 | 5/2016 | Song et al. |
| 9,349,706 B2 | 5/2016 | Co et al. |
| 9,362,161 B2 | 6/2016 | Chi et al. |
| 9,378,982 B2 | 6/2016 | Lin et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,508,622 B2 | 11/2016 | Higgins |
| 9,559,088 B2 | 1/2017 | Gonzalez et al. |
| 9,570,382 B2 | 2/2017 | Haba |
| 9,583,456 B2 | 2/2017 | Uzoh et al. |
| 9,601,454 B2 | 3/2017 | Zhao et al. |
| 2001/0042925 A1 | 11/2001 | Yamamoto et al. |
| 2002/0014004 A1 | 2/2002 | Beaman et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0161814 A1 | 7/2005 | Mizukoshi et al. |
| 2005/0173807 A1 | 8/2005 | Zhu et al. |
| 2005/0176233 A1 | 8/2005 | Joshi et al. |
| 2006/0087013 A1 | 4/2006 | Hsieh |
| 2006/0216868 A1 | 9/2006 | Yang et al. |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0164457 A1 | 7/2007 | Yamaguchi et al. |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0042265 A1 | 2/2008 | Merilo et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |

(56) References Cited

U.S. PATENT DOCUMENTS

| | | |
|---|---|---|
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0217708 A1 | 9/2008 | Reisner et al. |
| 2008/0246126 A1 | 10/2008 | Bowles et al. |
| 2008/0280393 A1 | 11/2008 | Lee et al. |
| 2008/0284045 A1 | 11/2008 | Gerber et al. |
| 2008/0303153 A1 | 12/2008 | Oi et al. |
| 2008/0308305 A1 | 12/2008 | Kawabe |
| 2009/0008796 A1 | 1/2009 | Eng et al. |
| 2009/0014876 A1 | 1/2009 | Youn et al. |
| 2009/0032913 A1 | 2/2009 | Haba |
| 2009/0085185 A1 | 4/2009 | Byun et al. |
| 2009/0085193 A1* | 4/2009 | Cho .............. B82Y 10/00 257/702 |
| 2009/0091009 A1 | 4/2009 | Corisis et al. |
| 2009/0102063 A1 | 4/2009 | Lee et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0166664 A1 | 7/2009 | Park et al. |
| 2009/0166873 A1 | 7/2009 | Yang et al. |
| 2009/0189288 A1 | 7/2009 | Beaman et al. |
| 2009/0194829 A1 | 8/2009 | Chung et al. |
| 2009/0256229 A1 | 10/2009 | Ishikawa et al. |
| 2009/0315579 A1 | 12/2009 | Beaman et al. |
| 2010/0032822 A1 | 2/2010 | Liao et al. |
| 2010/0044860 A1 | 2/2010 | Haba et al. |
| 2010/0078795 A1 | 4/2010 | Dekker et al. |
| 2010/0193937 A1 | 8/2010 | Nagamatsu et al. |
| 2010/0200981 A1 | 8/2010 | Huang et al. |
| 2010/0232119 A1 | 9/2010 | Schmidt et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0042699 A1 | 2/2011 | Park et al. |
| 2011/0068478 A1 | 3/2011 | Pagaila et al. |
| 2011/0101512 A1* | 5/2011 | Choi .............. H01L 24/29 257/686 |
| 2011/0157834 A1 | 6/2011 | Wang |
| 2011/0209908 A1 | 9/2011 | Lin et al. |
| 2011/0215472 A1 | 9/2011 | Chandrasekaran |
| 2012/0001336 A1 | 1/2012 | Zeng et al. |
| 2012/0043655 A1 | 2/2012 | Khor et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2012/0280386 A1* | 11/2012 | Sato .............. H01L 23/3121 257/737 |
| 2013/0001797 A1 | 1/2013 | Choi et al. |
| 2013/0040423 A1 | 2/2013 | Tung |
| 2013/0049218 A1 | 2/2013 | Gong et al. |
| 2013/0069239 A1* | 3/2013 | Kim .............. H01L 23/49827 257/774 |
| 2013/0087915 A1 | 4/2013 | Warren et al. |
| 2013/0109135 A1* | 5/2013 | Lee .............. H01L 23/49827 438/107 |
| 2013/0153646 A1 | 6/2013 | Ho |
| 2013/0187292 A1* | 7/2013 | Semmelmeyer .... H01L 25/0652 257/777 |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0323409 A1 | 12/2013 | Read et al. |
| 2013/0328178 A1 | 12/2013 | Bakalski et al. |
| 2014/0035892 A1 | 2/2014 | Shenoy et al. |
| 2014/0036454 A1 | 2/2014 | Caskey et al. |
| 2014/0103527 A1 | 4/2014 | Marimuthu et al. |
| 2014/0124949 A1 | 5/2014 | Paek et al. |
| 2014/0138816 A1 | 5/2014 | Lu et al. |
| 2014/0175657 A1 | 6/2014 | Oka et al. |
| 2014/0225248 A1 | 8/2014 | Henderson et al. |
| 2014/0239479 A1 | 8/2014 | Start |
| 2014/0239490 A1 | 8/2014 | Wang |
| 2014/0308907 A1 | 10/2014 | Chen |
| 2014/0312503 A1 | 10/2014 | Seo |
| 2015/0044823 A1 | 2/2015 | Mohammed |
| 2015/0076714 A1 | 3/2015 | Haba et al. |
| 2015/0206865 A1 | 7/2015 | Yu et al. |
| 2015/0340305 A1 | 11/2015 | Lo |
| 2015/0380376 A1 | 12/2015 | Mathew et al. |
| 2016/0043813 A1 | 2/2016 | Chen et al. |
| 2016/0172268 A1 | 6/2016 | Katkar et al. |
| 2016/0200566 A1 | 7/2016 | Ofner et al. |
| 2016/0225692 A1 | 8/2016 | Kim et al. |
| 2017/0117231 A1 | 4/2017 | Awujoola et al. |
| 2017/0229432 A1 | 10/2017 | Lin et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 10 2009 001 461 A1 | 9/2010 |
| DE | 10 2009 001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06268101 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |

(56) References Cited

FOREIGN PATENT DOCUMENTS

| | | |
|---|---|---|
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2000156461 A | 6/2000 |
| JP | 2000323516 A | 11/2000 |
| JP | 3157134 B2 | 4/2001 |
| JP | 2001196407 A | 7/2001 |
| JP | 2001326236 A | 11/2001 |
| JP | 2002050871 A | 2/2002 |
| JP | 2002289769 A | 10/2002 |
| JP | 2003122611 A | 4/2003 |
| JP | 2003-174124 A | 6/2003 |
| JP | 2003197668 A | 7/2003 |
| JP | 2003307897 A | 10/2003 |
| JP | 2003318327 A | 11/2003 |
| JP | 2004031754 A | 1/2004 |
| JP | 2004047702 A | 2/2004 |
| JP | 2004048048 A | 2/2004 |
| JP | 2004-172157 A | 6/2004 |
| JP | 2004-200316 A | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2005093551 A | 4/2005 |
| JP | 2005142378 A | 6/2005 |
| JP | 2005175019 A | 6/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2007123595 A | 5/2007 |
| JP | 2007-208159 A | 8/2007 |
| JP | 2007194436 A | 8/2007 |
| JP | 2007234845 A | 9/2007 |
| JP | 2007287922 A | 11/2007 |
| JP | 2007-335464 A | 12/2007 |
| JP | 200834534 A | 2/2008 |
| JP | 2008166439 A | 7/2008 |
| JP | 2008171938 A | 7/2008 |
| JP | 2008235378 A | 10/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 A | 2/2009 |
| JP | 2009508324 A | 2/2009 |
| JP | 2009064966 A | 3/2009 |
| JP | 2009088254 A | 4/2009 |
| JP | 2009111384 A | 5/2009 |
| JP | 2009528706 A | 8/2009 |
| JP | 2009260132 A | 11/2009 |
| JP | 2010103129 A | 5/2010 |
| JP | 2010135671 A | 6/2010 |
| JP | 2010192928 A | 9/2010 |
| JP | 2010199528 A | 9/2010 |
| JP | 2010206007 A | 9/2010 |
| JP | 2011514015 A | 4/2011 |
| JP | 2011166051 A | 8/2011 |
| KR | 100265563 A1 | 9/2000 |
| KR | 20010061849 A | 7/2001 |
| KR | 2001-0094894 A | 11/2001 |
| KR | 20020058216 A | 7/2002 |
| KR | 20060064291 A | 6/2006 |
| KR | 10-2007-0058680 A | 6/2007 |
| KR | 20080020069 | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 101215271 B1 | 12/2012 |
| KR | 20130048810 A | 5/2013 |
| KR | 20150012285 A | 2/2015 |
| TW | 200539406 A | 12/2005 |
| TW | 200721327 A | 6/2007 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| TW | I605558 B | 11/2017 |
| WO | 9615458 A1 | 5/1996 |
| WO | 02-13256 A1 | 2/2002 |
| WO | 03-045123 A1 | 5/2003 |
| WO | 2004077525 A2 | 9/2004 |
| WO | 2006050691 A2 | 5/2006 |
| WO | 2007101251 A2 | 9/2007 |
| WO | 2007116544 A1 | 10/2007 |
| WO | 2008065896 A1 | 6/2008 |
| WO | 2008120755 A1 | 10/2008 |
| WO | 2009096950 A1 | 8/2009 |
| WO | 2009158098 A2 | 12/2009 |
| WO | 2010014103 A1 | 2/2010 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

Invitation to Pay Additional Fees and, Where Applicable, Protest Fee, and includes Annex to Form PCT/ISA/206 Communication Relating to the Results of the Partial International Search issued by the European Patent Office for Int'l Patent Application No. PCT/US2015/032679 (dated Sep. 4, 2015) pp. 1-5.
International Search Report and Written Opinion for Appln. No. PCT/US2013/041981, dated Nov. 13, 2013.
International Search Report and Written Opinion for Appln. No. PCT/US2013/053437, dated Nov. 25, 2013.
International Search Report and Written Opinion for Appln. No. PCT/US2013/075672, dated Apr. 22, 2014.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2015/011715, dated Apr. 20, 2015.
International Preliminary Report on Patentability for Appln. No. PCT/US2014/055695, dated Dec. 15, 2015.
International Search Report and Written Opinion for Appln. No. PCT/US2016/056402, dated Jan. 31, 2017.
Japanese Office Action for Appln. No. 2013-509325, dated Oct. 18, 2013.
Japanese Office Action for Appln. No. 2013-520776, dated Apr. 21, 2015.
Japanese Office Action for Appln. No. 2013-520777, dated May 22, 2015.
Jin, Yonggang et al., "STM 3D-IC Package and 3D eWLB Development," STMicroelectronics Singapore/STMicroelectronics France, May 21, 2010, 28 pages.

(56) References Cited

OTHER PUBLICATIONS

Kim et al., "Application of Through Mold Via (TMV) as PoP Base Package," 2008, 6 pages.
Korean Office Action for Appn. 10-2011-0041843, dated Jun. 20, 2011.
Korean Office Action for Appn. 2014-7025992, dated Feb. 5, 2015.
Korean Search Report KR10-2010-0113271, dated Jan. 12, 2011.
Korean Search Report KR10-2011-0041843, dated Feb. 24, 2011.
Meiser, S., "Klein Und Komplex," Elektronik Irl Press Ltd, DE, vol. 41, No. 1, Jan. 7, 1992 (Jan. 7, 1992) pp. 72-77, XP000277326, [ISR Appln. No. PCT/US2012/060402, dated Feb. 21, 2013 provides concise stmt. of relevance).
Neo-Manhattan Technology, A Novel HDI Manufacturing Process, "High-Density Interconnects for Advanced Flex Substrates and 3-D Package Stacking," IPC Flex & Chips Symposium, Tempe, AZ, Feb. 11-12, 2003, 34 pages.
North Corporation, Processed intra-Layer Interconnection Material for PWBs [Etched Copper Bump with Copper Foil], NMBITM, Version 2001.6.
NTK HTCC Package General Design Guide, Communication Media Components Group, NGK Spark Plug Co., Ltd., Komaki, Aichi, Japan, Apr. 2010, 32 pages.
Partial International Search Report from Invitation to Pay Additional Fees for Appln. No. PCT/US2012/028738, dated Jun. 6, 2012.
Partial International Search Report for Appln. No. PCT/US2012/060402, dated Feb. 21, 2011.
Partial International Search Report for Appln. No. PCT/US2013/026126, dated Jun. 17, 2013.
Partial International Search Report for Appln. No. PCT/US2013/075672, dated Mar. 12, 2014.
Partial International Search Report for Appln. No. PCT/US2014/014181, dated May 8, 2014.
Partial International Search Report for Appln. No. PCT/US2015/033004, dated Sep. 9, 2015.
Redistributed Chip Package (RCP) Technology, Freescale Semiconductor, 2005, 6 pages.
Taiwan Office Action for 102106326, dated Dec. 13, 2013.
Taiwan Office Action for 100125521, dated Dec. 20, 2013.
Taiwan Office Action for 100125522, dated Jan. 27, 2014.
Taiwan Office Action for 100141695, dated Mar. 19, 2014.
Taiwan Office Action for 100138311, dated Jun. 27, 2014.
Taiwan Office Action for 100140428, dated Jan. 26, 2015.
Taiwan Office Action for 102106326, dated Sep. 8, 2015.
Taiwan Office Action for 103103350, dated Mar. 21, 2016.
Bang, U.S. Appl. No. 10/656,534, filed Sep. 5, 2003.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.
Chinese Office Action for Application No. 201180022247.8 dated Sep. 16, 2014.
Chinese Office Action for Application No. 201180022247.8 dated Apr. 14, 2015.
Chinese Office Action for Application No. 201310264264.3 dated May 12, 2015.
EE Times Asia "Freescale Cuts Die Area, Thickness with New Packaging Tech" [online] [Retrieved Aug. 5, 2010] Retrieved from internet: <http://www.eetasia.com/ART_8800428222_280300_NT_DEC52276.htm>, Aug. 3, 2006, 2 pages.
Extended European Search Report for Appln. No. EP13162975, dated Sep. 5, 2013.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report for Appln. No. PCT/US2005/039716, dated Apr. 5, 2006.
International Search Report and Written Opinion for Appln. No. PCT/US2011/024143, dated Sep. 14, 2011.
Partial Search Report—Invitation to Pay Fees for Appln. No. PCT/US2011/024143, dated Jan. 17, 2012.
International Search Report and Written Opinion for Appln. No. PCT/US2011/060551, dated Apr. 18, 2012.
International Search Report and Written Opinion for Appln. No. PCT/US2011/044342, dated May 7, 2012.
International Search Report and Written Opinion for Appln. No. PCT/US2011/044346, dated May 11, 2012.
International Search Report and Written Opinion for Appln. No. PCT/US2012/060402, dated Apr. 2, 2011.
International Search Report and Written Opinion for Appln. No. PCT/US2013/026126, dated Jul. 25, 2013.
International Search Report and Written Opinion for Appln. No. PCT/US2013/052883, dated Oct. 21, 2013.
U.S. Appl. No. 13/477,532, mailed May 22, 2012.
U.S. Office Action for U.S. Appl. No. 12/769,930, dated May 5, 2011.
3D Plus "Wafer Level Stack—WDoD", [online] [Retrieved Aug. 5, 2010] Retrieved from internet: <http://www.3d-plus.com/techno-wafer-level-stack-wdod.php>, 2 pages.
Written Opinion for Appln. No. PCT/US2014/050125, dated Jul. 15, 2015.
Yoon, PhD, Seung Wook, "Next Generation Wafer Level Packaging Solution for 3D Integration," May 2010, STATS ChipPAC Ltd.
International Search Report and Written Opinion for Appln. No. PCT/US2016/056526, dated Jan. 20, 2017.
International Search Report and Written Opinion for Appln. No. PCT/US2016/068297, dated Apr. 17, 2017.
Taiwan Search Report for 105128420, dated Sep. 26, 2017.
Chinese Office Action Search Report for Application No. 2014800551784 dated Jan. 23, 2018.
European Search Report for Appln. No. EP12712792, dated Feb. 27, 2018, 2 pages.
International Search Report and Written Opinion for Appln. No. PCT/US2017/064437, dated Mar. 29, 2018.
Ghaffarian Ph.D., Reza et. al., "Evaluation Methodology Guidance for Stack Packages," Jet Propulsion Laboratory, California Institute of Technology, Pasadena, CA, NASA, Oct. 2009, 44 pages.
Invensas Corporation, "High Performance BVA PoP package for Mobile Systems," May 2013, 20 pages.

* cited by examiner

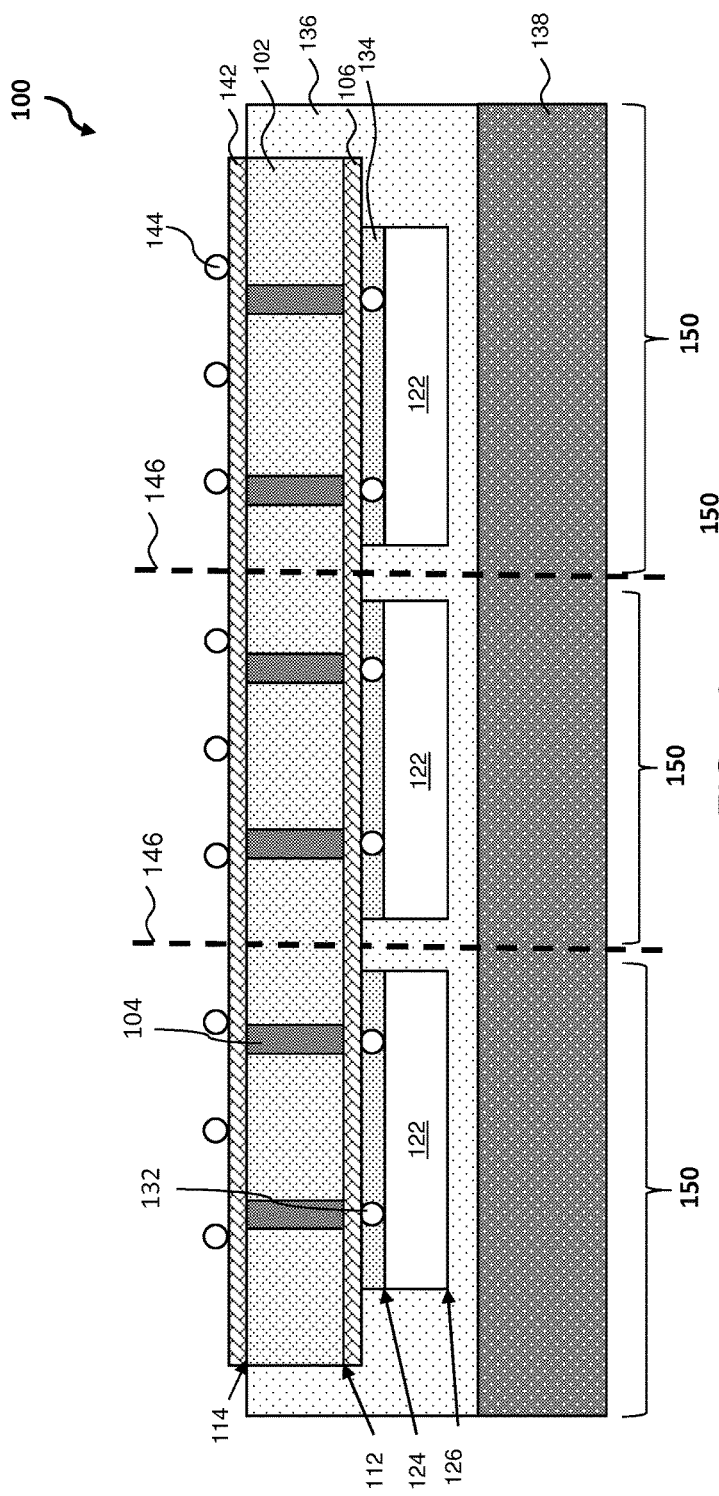
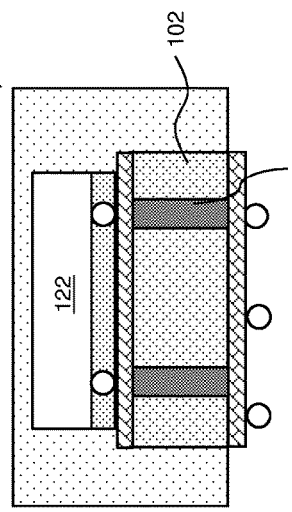
FIG. 4A
FIG. 4B

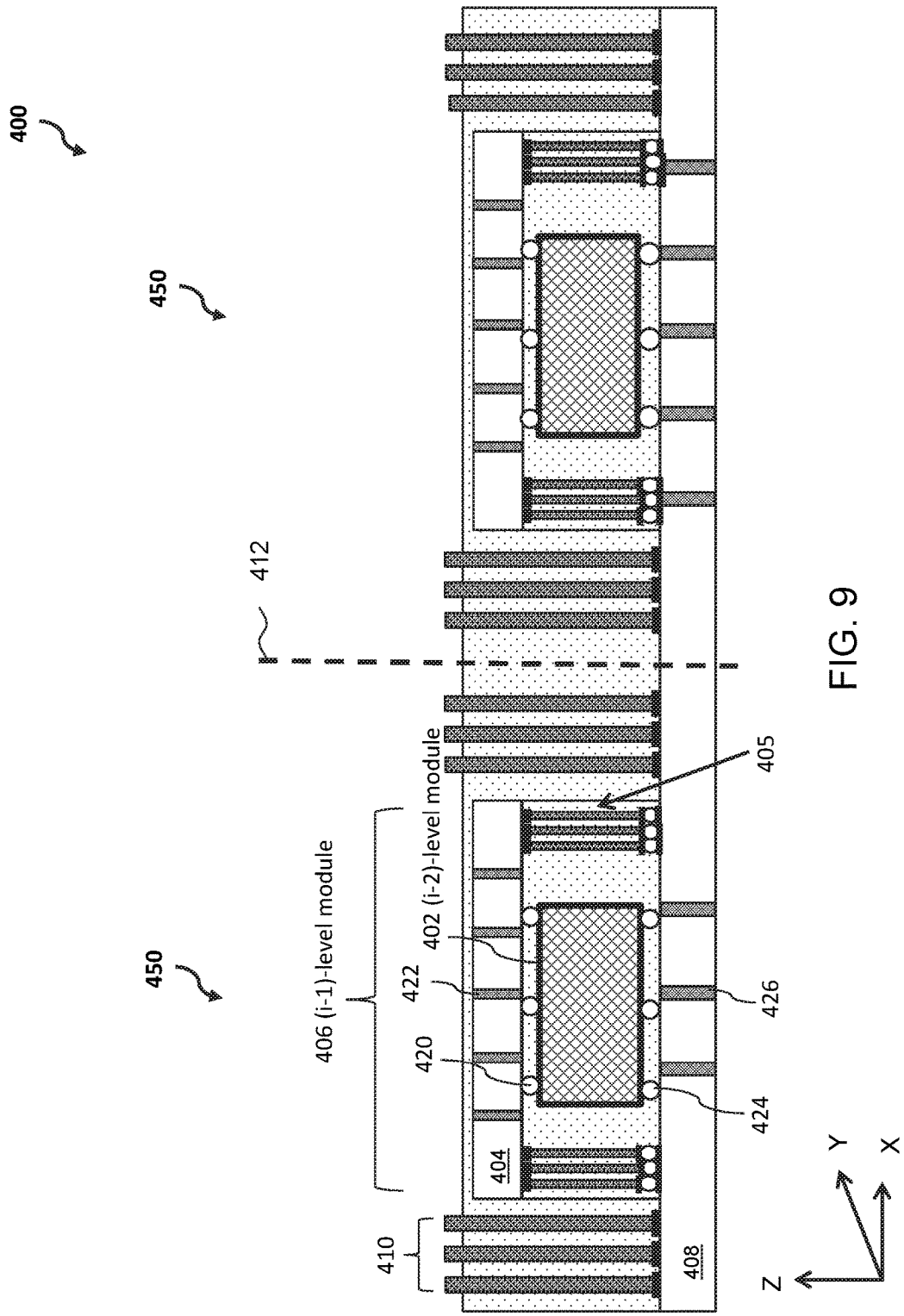

Hybrid stacking assembly

STRUCTURE AND METHOD FOR INTEGRATED CIRCUITS PACKAGING WITH INCREASED DENSITY

TECHNICAL FIELD

This present disclosure generally relates to integrated circuits (ICs) packaging technology, and more particularly to IC packaging with high density stacking.

BACKGROUND ART

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As one example, the effort to increase IC functionality within a reduced area has led to the introduction of 3D-IC designs. In such designs, multiple layers of active electronic devices are vertically integrated, for example within a single substrate or by using stacked substrates. 3D-IC designs can offer improved performance (e.g., due to shorter interconnects) as well as heterogeneous functionality (e.g., logic, memory, image sensors, MEMS, etc.) in a reduced form factor. One important tool in the development of 3D ICs has been through substrate via (TSV) technology, which provides an electrically conductive path between a front- and back-side of a substrate, providing for the vertical stacking of multiple die (or "chips"). However, stacked die which utilize TSVs also present challenges such as heat dissipation, interconnect routing and cell placement, and transistor reliability, among others.

Some of the challenges of TSV implementation have been addressed with the introduction of silicon interposers. Silicon interposers can be used for TSV formation while not containing any active devices, thus mitigating issues introduced in active die which contain TSVs. Moreover, an interposer disposed between active die can be used to rewire connections between the die, for example by reconfiguring an input/output (I/O) count between a front-side and a back-side of the interposer.

While TSVs and silicon interposers have been key enablers for 3D-IC technology, continued improvements in system integration and bandwidth require even higher device and I/O density, reduced power consumption, and improved access times (e.g., to memory blocks), all within an ever-reducing form factor. Accordingly, improved semiconductor packaging solutions for 3D-IC systems, which provide high density I/O configurations while maintaining a compact design, are desired.

SUMMARY

In some embodiments, as described herein, a method of forming a semiconductor package comprises forming one or more first vias in a first side of a substrate; attaching a first side of a first microelectronic element to the first side of the substrate, the first microelectronic element electrically coupled to at least one of the one or more first vias; obtaining a second microelectronic element including one or more second vias in a first side of the second microelectronic element, with one or more connecting elements each of which has a first end attached to a first side of the second microelectronic element; and attaching a second side of the substrate to the first side of the second microelectronic element, the second microelectronic element electrically coupled to at least one of the one or more first vias. In some embodiments, a second end of each of the one or more connecting elements extends beyond a second side of the first microelectronic element.

In some embodiments, a semiconductor package comprises a substrate comprising one or more first vias extending through the substrate from a first side of the substrate to a second side of the substrate; a first microelectronic element attached to the first side of the substrate and electrically coupled to at least one of the one or more first vias; a second microelectronic element attached to the second side of the substrate and electrically coupled to at least one of the one or more first vias; and one or more connecting elements each having a first end attached to the second microelectronic element and a second end extending beyond the first microelectronic element.

In some embodiments, a semiconductor package comprises a substrate comprising one or more vias extending through the substrate from a first side of the substrate to a second side of the substrate; a first microelectronic element attached to the first side of the substrate and electrically coupled to at least one of the one or more vias; and an encapsulation layer encapsulating the first microelectronic element and the substrate. In some embodiments, the encapsulation layer comprises a carbon material dispersed therein to increase thermal conductivity of the encapsulation layer. In some embodiments, the semiconductor package further comprises a second microelectronic element attached to the second side of the substrate and electrically coupled to at least one of the one or more vias; and one or more connecting elements each having a first end attached to the second microelectronic element and a second end extending beyond the first microelectronic element. In some embodiments, at least one of the one or more connecting elements comprises a carbon material to increase thermal conductivity of the at least one of the one or more connecting elements.

BRIEF DESCRIPTION OF THE DRAWINGS

FIGS. 1-3, and 4A-4B are cross-sectional views of an integrated circuits (IC) assembly fabricated according to some embodiments of the present disclosure.

FIG. 9 is a cross-sectional view of an IC assembly formed by stacking various modules according to some embodiments of the present disclosure.

DESCRIPTION OF SOME EMBODIMENTS

In addition to the foregoing features, other features and advantages will be understood by persons of ordinary skill in the art having benefit of the present description. The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
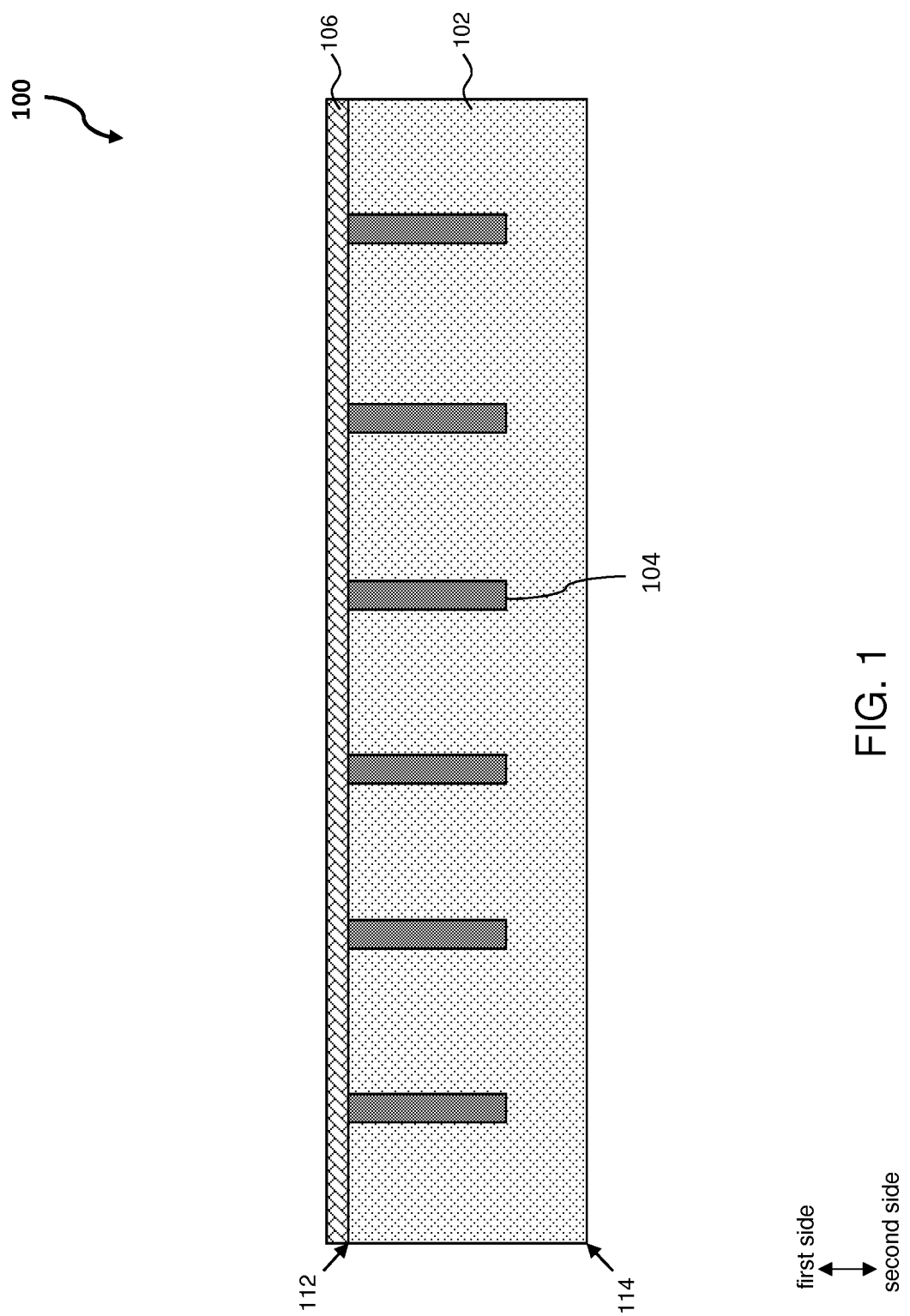

FIGS. 1-3, and 4A-4B are cross-sectional views of an integrated circuit (IC) assembly 100 fabricated according to some embodiments of the present disclosure. Referring to FIG. 1, the IC assembly 100 includes an interposer substrate 102 having a first (top) side 112 and a second (bottom) side 114. In some embodiments, interposers are used as intermediate substrates (e.g., between die or die packages, between printed circuit boards and die, etc.) which are useful for rewiring input/output (I/O) terminals between the back side and the front side of the interposer substrate 102, and/or to improve heat dissipation and mechanical strength, and/or absorb mismatches of coefficients of thermal expansion (CTE) between other components of the system. The interposer substrate 102 may be initially chosen to be sufficiently thick to provide easy handling and adequate heat dissipation in fabrication, and can be thinned later. In some embodiments, the interposer substrate 102 may include a single crystal silicon (Si) wafer with a diameter of about 200 mm or about 300 mm, and a thickness of about 650 micron or more. These materials and dimensions are merely exemplary and not limiting. The interposer substrate 102 may also include other semiconductor materials (e.g., gallium arsenide GaAs), glass, sapphire, metal, or possibly other materials. Other possible materials for the interposer substrate 102 may include NbTaN and LiTaN. In some embodiments, the interposer may also include active circuits, e.g. transistors.

Still referring to FIG. 1, the interposer substrate 102 may include one or more electrically conductive vias 104. The vias 104 may be "blind vias", terminating inside the interposer substrate 102 as shown in the exemplary FIG. 1. Alternatively, one or more vias 104 may penetrate the interposer substrate 102, forming through substrate vias (TSVs). The vias 104 may include, or be made of, copper (Cu), tungsten (W), or any other suitable metal or non-metal conductive materials. In some embodiments, the vias 104 may be formed using a lithography process, an etching process, and a filling/deposition process. The lithography process may include forming a resist layer (not shown) over the first side 112 of the interposer substrate 102 and patterning the resist layer to define the locations of the vias 104. The etching process may then be performed using the patterned resist layer as an etching mask to form one or more holes for vias 104 in the interposer substrate 102. The etching process may include a dry etch such as a reactive ion etching (RIE) process. The vias 104 may include vertical, sloped, or any other shapes. Conductive material may then be deposited into the holes to form the vias 104. Dielectric can be formed between the conductive material and the holes' surfaces if needed for electrical insulation. A barrier layer can be formed between the conductive material and the holes' surfaces if needed for improved adhesion and preventing interdiffusion, as known in the art. The vias can be formed, for example, by electroplating or other techniques.

Still referring to FIG. 1, a first redistribution layer (RDL) 106 is formed on the first (top) side 112 of the interposer substrate 102. In some embodiments, the first RDL 106 includes interconnect lines (not shown) insulated from each other and insulated from interposer substrate 102 by the RDL's dielectric (not shown separately). The RDL provides contact pads (not shown) on top of the interposer. The RDL's interconnect lines interconnect the contact pads and vias 104 in the interposer substrate 102 as desired; an interconnect may connect contact pads to each other and/or to one or more vias 104, or may connect vias 104 to each other. In the various embodiments described herein, the interposer substrate 102 and RDLs (including the first RDL 106 or other RDL layers described below) may also include transistors, resistors, capacitors, and other devices (not shown). It is to be understood that FIG. 1 is merely exemplary and the first RDL 106 may be omitted.

Figure 2:
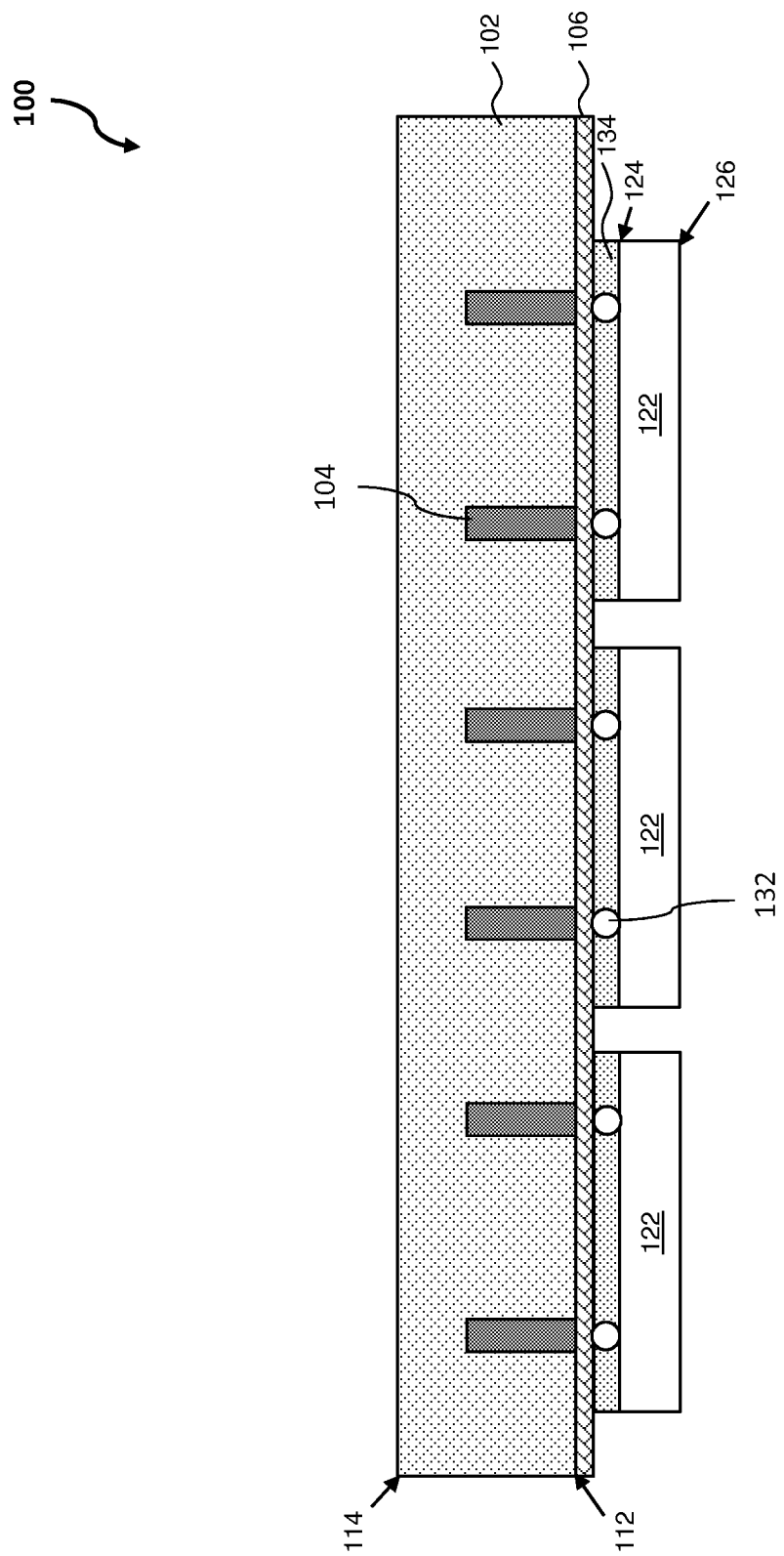

Referring to FIG. 2, the interposer substrate 102 is rotated with the second (bottom) side 114 facing up and the first (top) side 112 facing down. In some embodiments, one or more first microelectronic (ME) elements 122 (e.g. chips (also called die, or possibly other electronic assemblies or packages) are attached to the first side 112 of the interposer substrate 102. For example, the circuitry of ME elements 122 may be coupled to the vias 104. ME elements 122 may include any types of circuits, including possibly memory, logic, control, and/or other types. Each ME element 122 has a first side 124, and a second side 126. As shown in FIG. 2, the first side 124 of each ME element 122 is attached to the first RDL 106 formed over the first side 112 of the interposer 102. In some alternative examples, the first side 124 of at least one ME element 122 is attached directly to the first side 112 of the interposer 102 without using the first RDL 106. In some examples, one or more of the vias 104 may be used to provide electrical connection and/or thermal conduction paths to transfer heat away from the ME elements or from other heat-sensitive components (i.e. a via 104 may have no electrical functionality).

Still referring to FIG. 2, in order to attach the first side 124 of each ME element 122 to the first side 112 of the interposer 102, one or more contact elements 132 (e.g. solder balls) may be formed on the first RDL 106. The contact elements 132 may also include conductive or anisotropic adhesive, or other types of connections. The contact elements 132 are a schematic representation of attachments to other structures as described below, and in some embodiments the contact elements 132 are not separate elements (e.g. if the attachment is by thermocompression). If contact elements 132 are separate elements, they may be attached to one or more contact pads (not shown) provided by the first RDL 106. The contact elements 132 may include metals such as tin (Sn), indium (In), gold (Au), or metal alloys. There examples are exemplary embodiments and not limiting. The contact elements 132 may have any other suitable form, such as elongated connectors, and/or a series of stacked conductive masses.

Still referring to FIG. 2, an underfill 134 may be formed between the first RDL 106 and the first side 124 of each ME element 122. In some examples, the underfill 134 may be formed prior to or after the attachment of the ME elements 122. The underfill 134 may include an epoxy with silica or other particles, or other suitable polymeric materials. The underfill 134 may protect the ME elements and/or electrical connections (e.g., contact elements 132) from moisture and other contaminants, ultraviolet light, alpha particles, and possibly other harmful elements. The underfill 134 can also strengthen the attachment between RDL and the ME elements. In some embodiments, the underfill may 134 may also help to conduct heat away from the ME elements 122.

Figure 3:
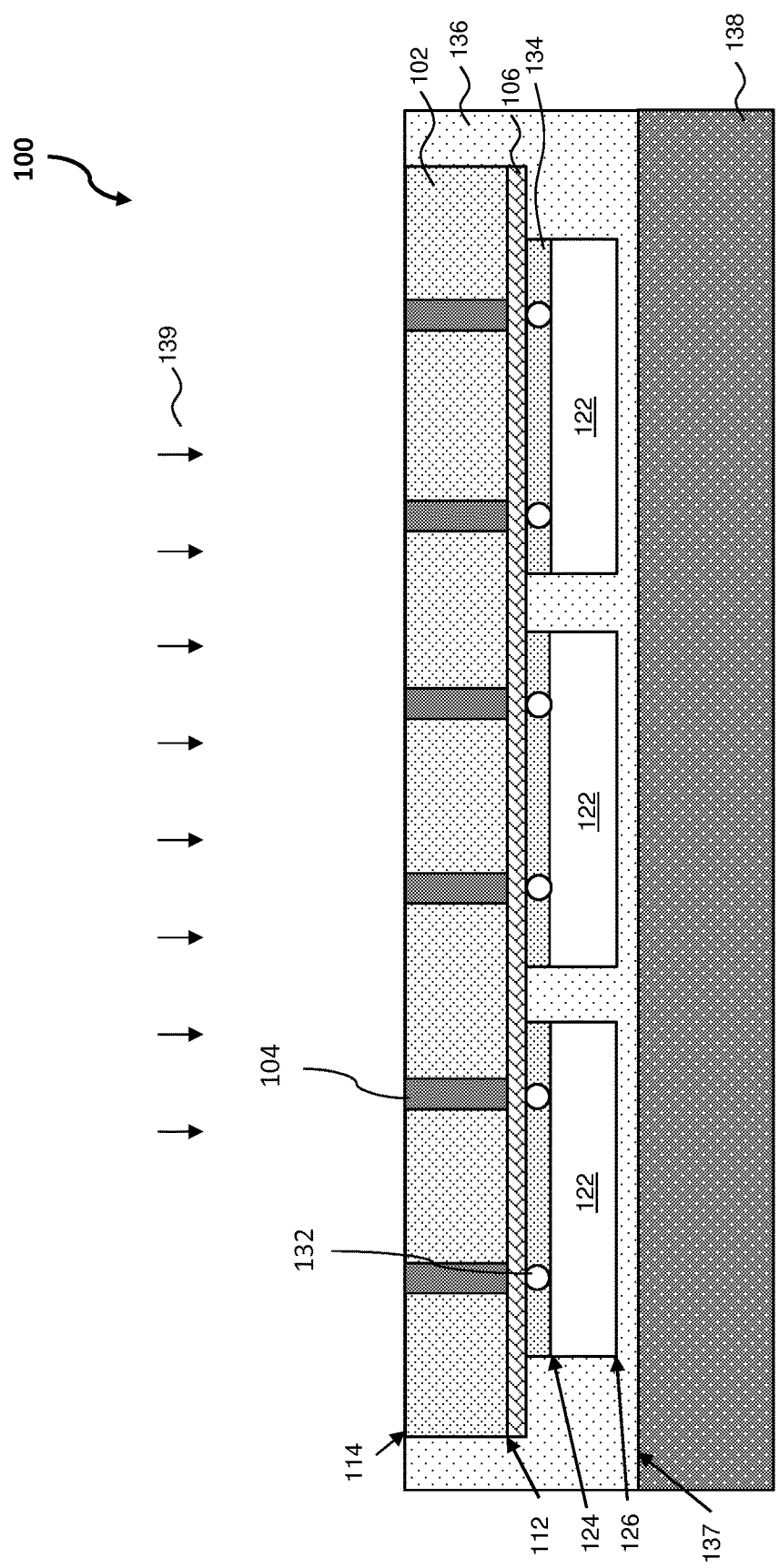

Referring to FIG. 3, in some embodiments, an encapsulation 136 is formed over the second sides 126 of ME elements 122 by molding or other techniques. The encapsulation 136 includes any suitable materials, such as epoxy with silica or other particles, or other suitable polymeric materials. In some embodiments, the encapsulation 136 includes carbon materials, such as graphite, dispersed in the encapsulation 136 to increase thermal conductivity of the encapsulation 136.

Optionally, carrier wafer 138 can be attached to a surface 137 of encapsulation 136. The carrier wafer 138 can be used as a support wafer during processing and can be removed upon process completion. For example, when the IC assembly 100 has sufficient mechanical strength to withstand handling, the carrier wafer 138 may be unnecessary.

As shown in FIG. 3, if one or more of the original vias 104 are "blind vias" as shown in FIG. 1, the interposer substrate 102 is then thinned from the second side 114 to expose the buried ends of the vias 104 and thus turn the blind vias into TSVs. The back-side thinning process 139 may include reactive ion etching (RIE) and/or other dry etching processes, and/or wet etching, and/or grinding and/or lapping and/or chemical mechanical polishing (CMP) and/or other processes. A planar surface may be formed by the TSVs 104 and the interposer substrate 102 after the thinning process 139 as shown in FIG. 3. In other embodiments, TSVs 104 protrude out of the interposer. See e.g. U.S. Pat. No. 6,639,303 issued Oct. 28, 2003 to Siniaguine and incorporated herein by reference.

In an alternative embodiment, vias 104 are not provided at the stage of FIG. 1 but are formed after thinning the interposer substrate to obtain the structure of FIG. 3. In other embodiments, the holes for vias 104 are formed at the stage of FIG. 1, but the holes are filled with conductive material at the stage of FIG. 3. The dielectric or other layers in vias 104 can be formed partly at the stage of FIG. 1 and partly at the stage of FIG. 3.

Referring to FIG. 4A, a second RDL 142 is formed on the second side 114 of the interposer 102. The RDL 142 provides contact pads (not shown) on side 114 of the interposer. The RDL's interconnect lines interconnect the contact pads and vias 104 in the interposer substrate 102 as desired; an interconnect may connect contact pads to each other and/or to one or more vias 104, or may connect vias 104 to each other. In some embodiments, the interposer substrate 102, the RDL 106, and the RDL 142 may include transistors, resistors, capacitors, and/or other devices (not shown). The components and methods used to form the RDL 142 may be substantially similar to those for the RDL 106. In some embodiments, the RDL 142 is omitted.

One or more contact elements 144 are shown on the second RDL 142. These may be separate elements, such as solder balls, or just a schematic representation indicating possible attachment to other structures. If they are separate elements, they may be attached to one or more contact pads (not shown) provided by the second RDL 142. The contact elements 144 may include a bond metal such as tin (Sn), indium (In), gold (Au), metal alloys, or a curable material. It is to be understood that the contact elements 144 such as solder balls shown in FIG. 4A are merely exemplary embodiments and are not intended to be limiting. The contact elements 144 may have any other suitable form, such as elongated connectors (e.g. copper posts), and/or a series of stacked conductive masses. The contact elements 144 may be substantially similar to the contact elements 132 shown in FIG. 2.

Still referring to FIG. 4A, the IC assembly 100 is then diced along the dice lines 146 to form a plurality of first-level modules 150. The carrier wafer 138 may be removed before or after dicing. As shown in FIG. 4B, each first-level module 150 includes an ME element 122 stacked on the interposer 102, and the interposer 102 includes one or more TSVs 104. (Of note, we use numeral 102 to refer both to the interposer substrate 102 and to the entire interposer, i.e. the substrate with the RDLs.) In some embodiments, the TSVs 104 are coupled to the ME element 122 to provide electrical connection between the ME element 122 and the other components in the IC packaging, and/or thermal conduction to transfer heat away from the ME element 122.

Figure 5:
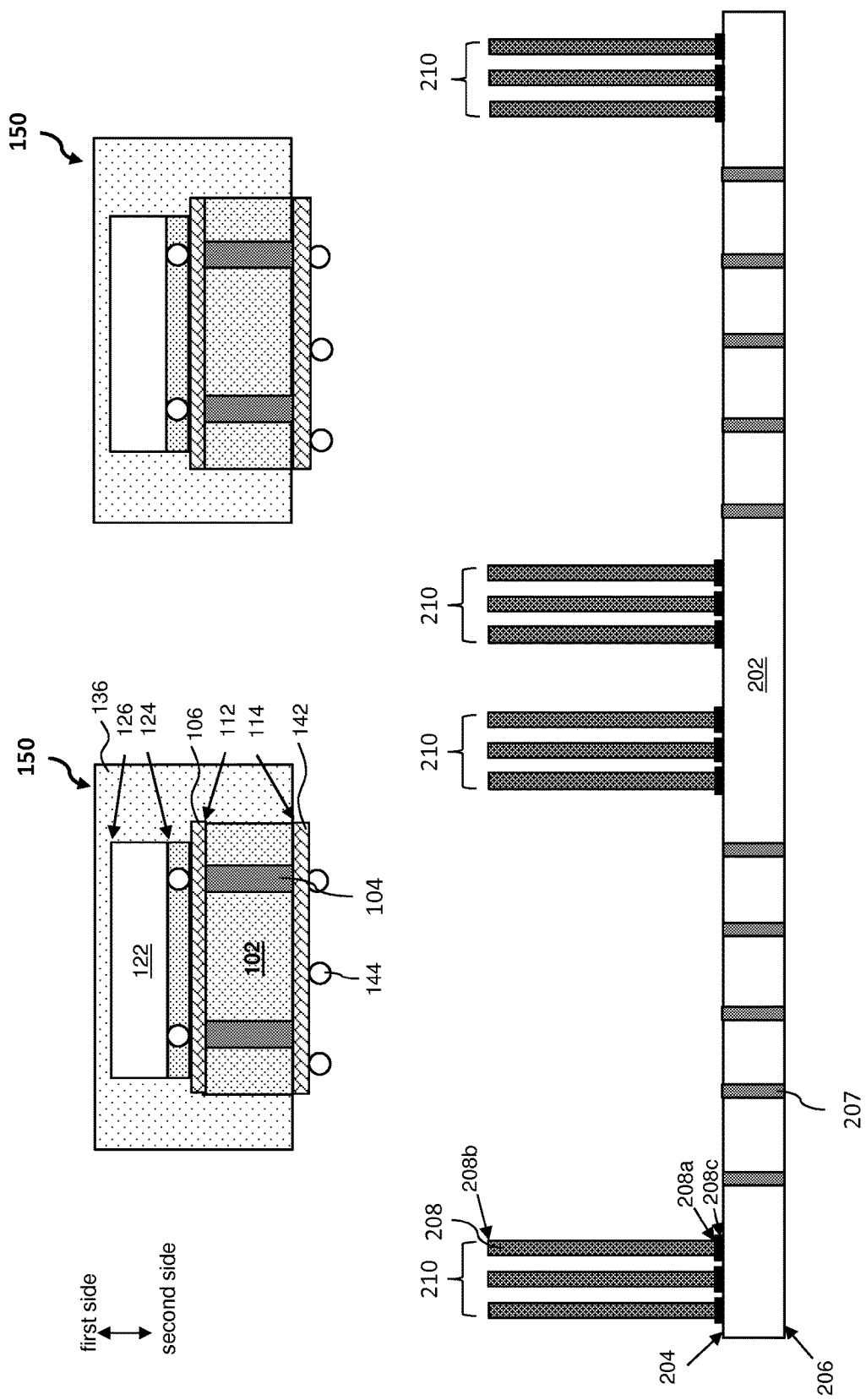
FIG. 5 is a schematic cross-sectional view of components of an IC assembly according to some embodiments of the present disclosure.
Figure 6:
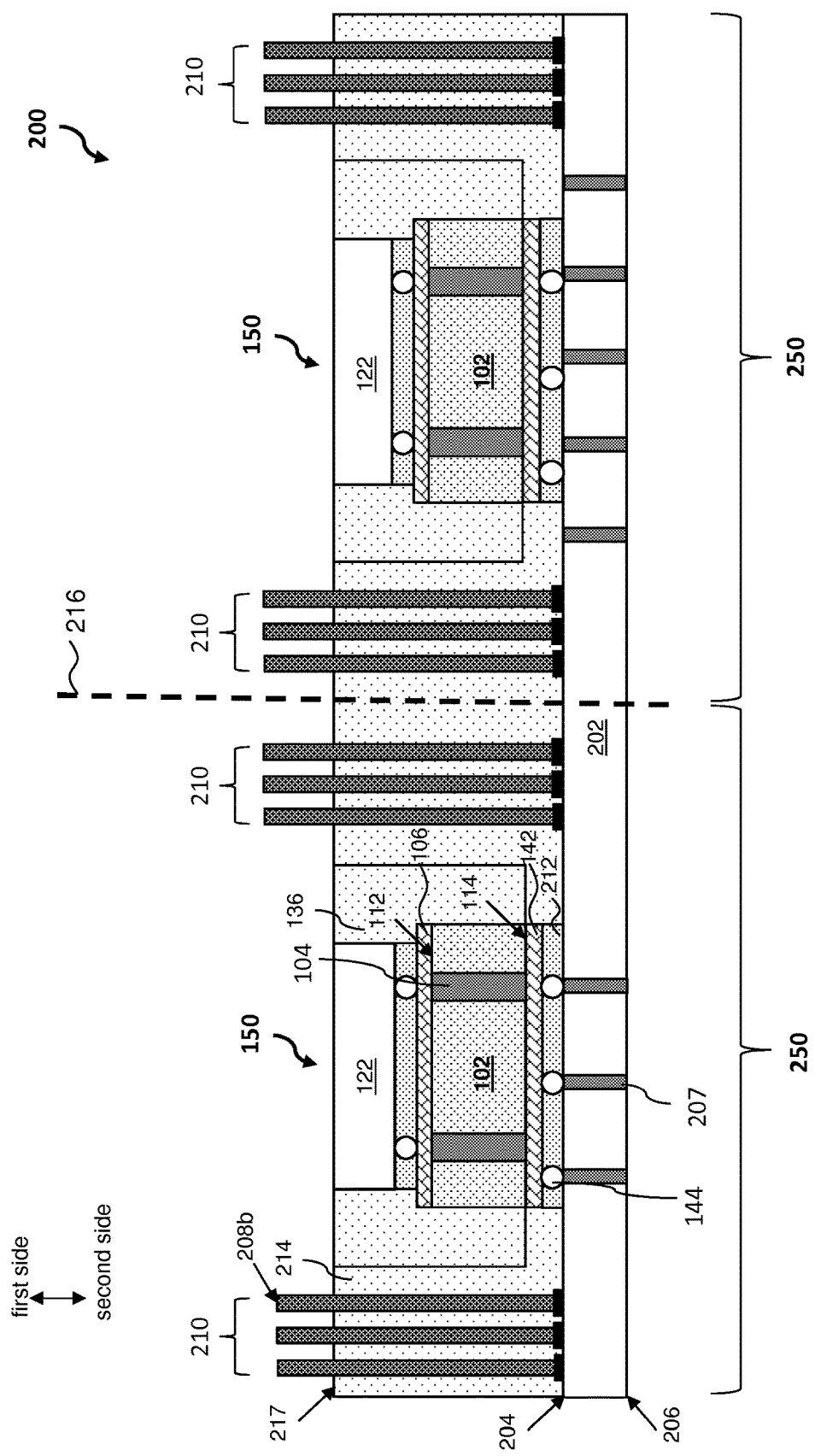
FIG. 6 is cross-sectional view of an IC assembly according to some embodiments of the present disclosure.

FIGS. 5-6 are cross-sectional views of an IC assembly 200 according to some embodiments of the present disclosure. In the present embodiment, the IC assembly 200 includes multiple ME elements, i.e. two ME elements stacked together. The IC assembly 200 may be used to fabricate one or more second-level modules 250 (FIGS. 7A, 7B) as discussed below. The IC assembly 200 and the second-level module 250 are exemplary and not limiting. The IC assembly may include any suitable numbers of ME elements stacked together.

Referring to FIG. 5, a second ME element 202 may include a wafer or a chip ("die") including a semiconductor integrated circuit, which could include memory, logic or control circuitry (e.g. a computer processor), or other types of circuits. The second ME element 202 may or may not be substantially similar to the ME element 122, e.g. the two ME elements may perform the same or different functions. The second ME element 202 may include a substrate different from the substrate of the first ME element 122.

Still referring to FIG. 5, the ME element 202 has a first (top) side 204, and a second (bottom) side 206. The ME element 202 includes one or more electrically conductive vias 207. In some embodiments as shown in FIG. 5, the vias 207 are through substrate vias (TSVs) 207 extending from the top side 204 through the ME element 202 to the bottom side 206. The TSVs 207 may be made by the same processes as discussed above for TSVs 104 in the interposer 102. In some alternative embodiments, the vias 207 are "blind vias" extending from side 204 and terminating inside the ME element 202.

Alternatively, the ME element 202 may include a substrate (e.g. semiconductor, glass, and/or other materials) with an RDL (not shown) on top and/or bottom; the vias 207 are made in the substrate as blind vias or TSVs 207 passing through the substrate; vias 207 are connected to top and/or bottom contact pads of ME element 202, and possibly to each other, by the RDL interconnects as needed.

As shown in FIG. 5, one or more connecting elements 208 are formed on the first side 204 of the second ME element 202. In some embodiments, each connecting element 208 includes a first end (e.g., base) 208a attached to ME element 202, and includes the opposite second end (e.g., tip) 208b. Connecting elements 208 may or may not be vertical. The first end 208a may be widened to provide a pad 208c on the first side 204 of the second ME element 202. The pad 208c may be made of copper, nickel, aluminum, tin, palladium, other suitable conductive material, or combinations thereof. In some embodiments, the connecting element 208 may include conductive materials such as copper, nickel, aluminum, tin, palladium, or other suitable conductive materials to provide electrical conduction between the ME element 202 and the other components. In some embodiments, the connecting element 208 may include carbon materials, such as graphite, to increase the thermal conductivity and to transfer heat away from the second ME element 202. In some embodiments, the connecting elements 208 may be arranged to form connecting arrays 210. The connecting arrays 210 may be formed at the peripheral areas to surround the first-level modules 150 to be attached to the second ME element 202 as discussed below. Connecting elements 208 can be wires bonded to ME element 202 as described, for example, in *Invensas™ High Performance BVA PoP package for Mobile Systems*, May 2013 by Invensas Corporation of San Jose, Calif., and is incorporated herein by reference. See also U.S. Pat. No. 8,618,659 issued Dec. 31, 2013 to Sato et al. and incorporated herein by reference.

Referring to FIG. 6, one or more first-level modules 150 are attached to the first side 204 of the second ME element 202. In some embodiments, the vias 207 of the second ME element 202 may be coupled to the vias 104 of the interposer 102. In some examples as shown in FIG. 6, the second RDL 142 is formed over the second side 114 of the interposer substrate 102 and electrically coupled to the vias 207 of the second ME element 202 and the interposer 102. The RDL 142 is attached to contact elements 144 placed on the second ME element 202. In some alternative examples, the interposer 102 may be directly attached to the second ME element 202 without using the second RDL 142. Prior to or after attaching the first-level module 150 to the second ME element 202, an underfill 212 may be formed between the second RDL 142 and the second ME element 202. The underfill 212 can be made of the same materials, and perform the same function, as described above for underfill 134.

In some embodiments as shown in FIG. 6, connecting arrays 210 are formed at the peripheral areas to partly or completely surround the first-level modules 150 attached to the second ME element 202. In some embodiments, the conducting elements 208 may include pads, conductive masses (e.g., solder balls), Bond Via Array™ (BVA) technology from Invensas Corporation of San Jose, Calif., or any other suitable elements.

Still referring to FIG. 6, an encapsulation 214 is formed over the first side 204 of the second ME element 202, possibly by molding, possibly using the same techniques and materials and performing the same functions as described above for encapsulation 136. In some embodiments, the second ends 208b of the connecting elements 208 protrude out of a surface 217 of the encapsulation 214. The protruding ends 208b may extend beyond the ME element 122 as shown in FIG. 6. The protruding ends 208b may be used to connect other components in the IC package. The protruding ends 208b may be available for electrical conduction and/or thermal conduction.

In some embodiments, a carrier wafer (not shown) may be attached to the bottom of ME element 206 to provide support during processing, and the carrier wafer may be removed upon process completion. The carrier wafer may be optional.

Still referring to FIG. 6, the IC assembly 200 is then diced along the dice lines 216 to form the one or more second-level modules 250. Each the second-level module 250 includes an ME element 122 stacked on the first side 112 of the interposer 102, and the second ME element 202 stacked on the second side 114 of the interposer 102. The interposer 102 includes one or more TSVs 104. The second ME element 202 may also include one or more TSVs 207. In some embodiments, at least one of the TSVs 104, the TSVs 207, and the connecting elements 208/connecting arrays 210 may provide electrical connection and/or thermal conduction in the second-level module 250.

Figure 7B:
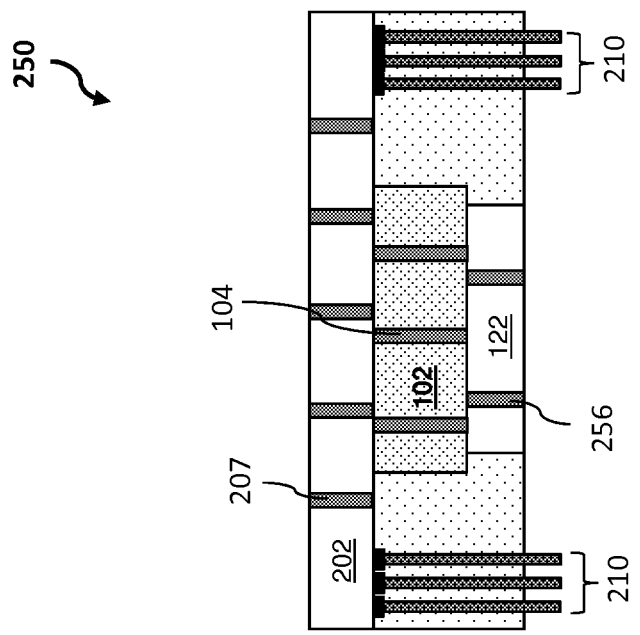
FIGS. 7A-7B are cross-sectional views a second-level module according to some embodiments of the present disclosure.
Figure 7A:
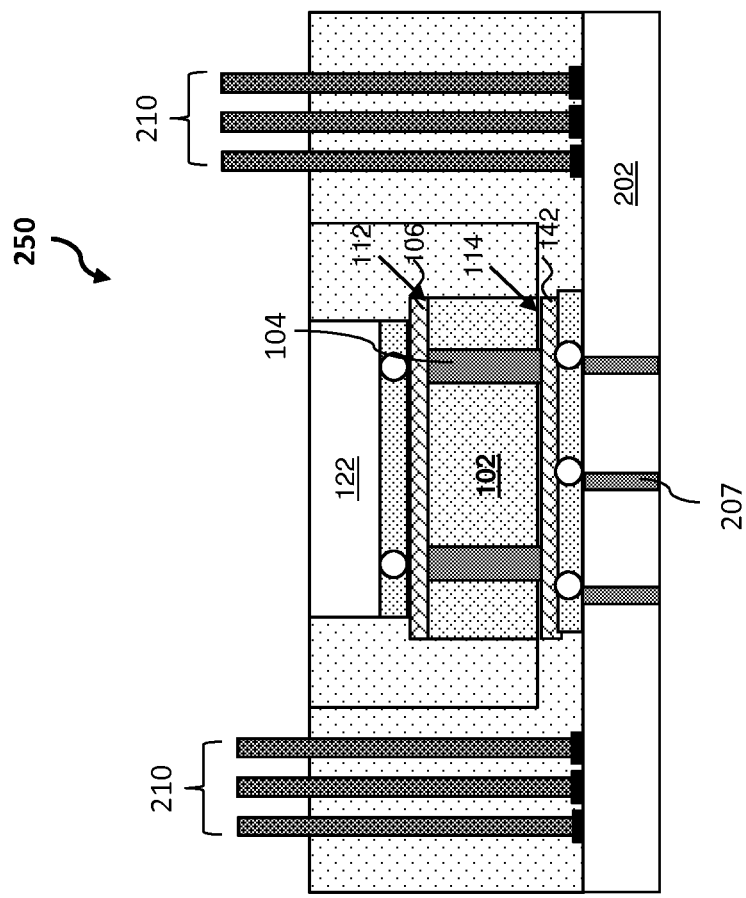

FIGS. 7A-7B are cross-sectional views of a second-level module 250 according to some embodiments of the present disclosure. FIGS. 7A and 7B show similar structures except that FIG. 7B does not have RDLs on the interposer. Second-level module 250 includes the interposer 102, the ME element 122 disposed on the first side 112 of the interposer 102, and the second ME element 202 disposed on the second side 114 of the interposer 102. Each of the interposer 102, the ME element 122, and the second ME element 202 may include one or more TSVs (e.g., TSVs 104, TSVs 256, or TSVs 207). The connecting arrays 210 (e.g., BVAs) may also be formed on the second ME element for connecting the second ME element to other components (not shown). As shown in FIGS. 7A-7B, the connecting arrays 210 include protruding ends which extend beyond the ME element 122. The TSVs and the connecting arrays 210 may be used for electrical conduction and/or thermal conduction. In some embodiments, RDL (e.g., RDL 106 and/or RDL 142) may be formed on the first side 112 and/or the second side 114 as shown in FIG. 7A. In some embodiments, one or more contact elements (e.g., solder balls) and underfill may be used for attaching the ME element 122 and/or the second ME element 202 to the interposer 102 as shown in FIG. 7A. Molding or other process may also be performed to encapsulate the second-level module 250 into additional encapsulant (not shown).

Figure 8B:
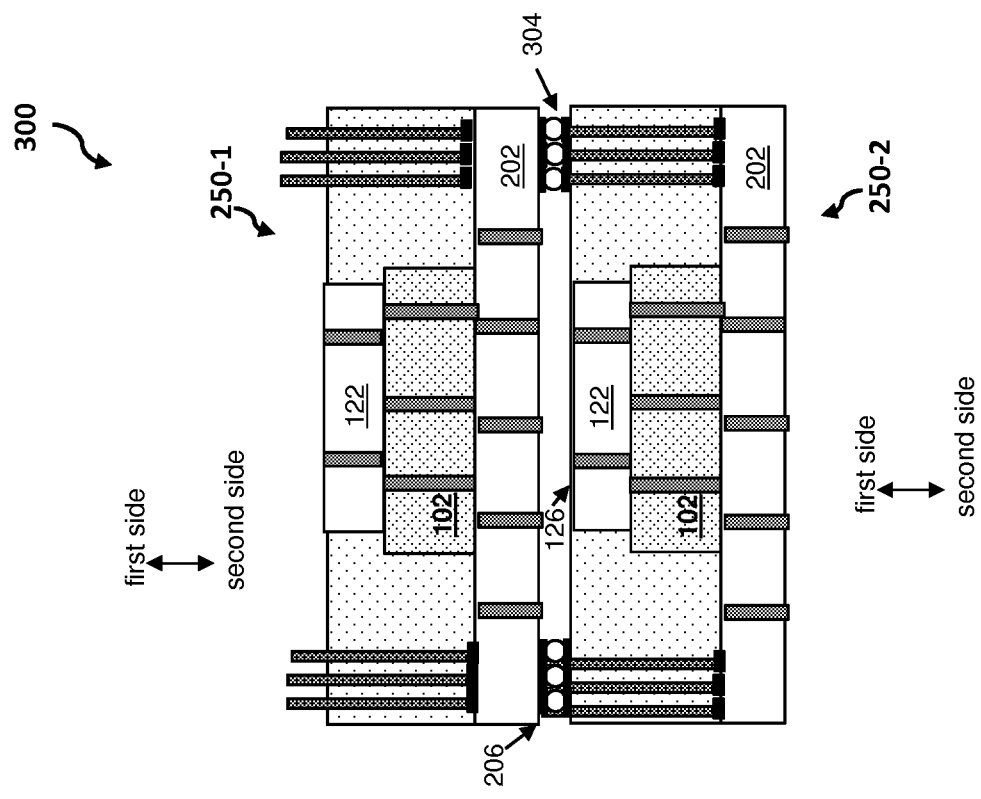
FIGS. 8A-8B are cross-sectional views of fourth-level modules formed by stacking two second-level modules in various embodiments of the present disclosure.
Figure 8A:
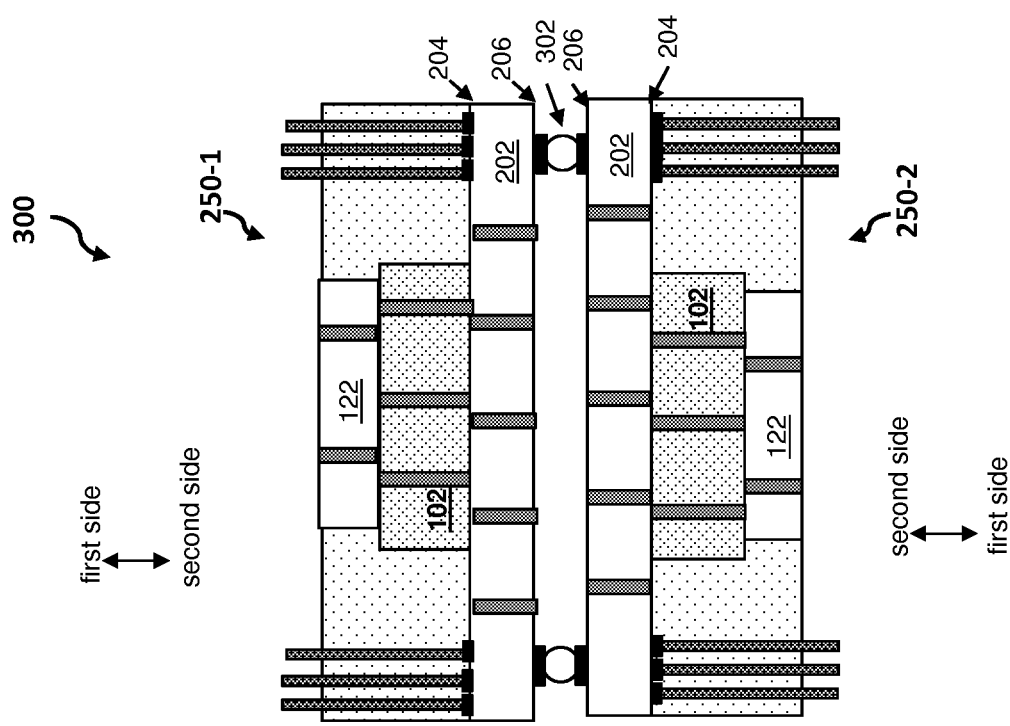

FIGS. 8A-8B are cross-sectional views of exemplary fourth-level modules 300 each of which is a stack of two second-level modules 250 (i.e. 250-1 and 250-2). In FIG. 8A, the modules 250-1, 250-2 are attached to each other bottom-to-bottom (i.e. second side to second side): the second sides 206 of the second ME element 202 of second-level modules 250-1 and 250-2 may be attached to each other using connections 302. Each connection 302 may include one or more connecting elements (e.g., solder balls) or other types of connections attached to one or more pads in the second-level modules. (Connections 302 can also be simply schematic representations and not separate physical elements if, say, thermocompression is used.)

In FIG. 8B, the modules 250-1, 250-2 are attached to each other bottom-to-top: the second (bottom) side 206 of the second ME element 202 of module 250-1 is attached to the top of module 250-2, i.e. to the second side 126 of the first ME element 122 of module 250-2. The attachment is by connections 304 which can be as connections 302.

FIG. 9 is an example of such assembly 400, showing a cross-sectional view. The IC assembly 400 may be formed by sequentially stacking a number i of modules from the first level to the i-th level using the process substantially similar to the process discussed in FIGS. 1-6, 7A-7B, and 8A-8B. For example, an (i–2)-level module 402 (generally representing for example one or more first-level modules 150 of FIG. 5; second-level modules 250 of FIG. 7A or 7B; or a stack such as of two second-level modules 250-1 and 250-2 of FIG. 8A or 8B) may be attached to a (i–1)-th ME element 404 to form a (i–1)-level module 406. The (i–2)-level module 402 may include a number i–2 of ME elements attached to each other and possibly separated by one or more interposers. Each ME element and each interposer included in the (i–2)-level module 402 may include one or more TSVs. The (i–2)-level module 402 may be attached to the (i–1)-the ME element 404 by contacts 420 (e.g., solder balls, BVAs, or TSVs). The (i–1)-the ME element 404 may include TSVs 422 or BVAs 422. The contacts 420 may be coupled to the TSVs 422 or BVAs 422 of the (i–1)-the ME element 404. One or more connecting arrays 405 may be formed on the (i–1)-th ME element 404, and the (i–2)-level module 402 may then be attached to and encapsulated (e.g. molded) together with the (i–1)-th ME element 404 to form the (i–1)-level module 406.

Still referring to FIG. 9, the connecting arrays 410 may be formed on an i-th ME element 408, and the formation of the connecting arrays 410 may be substantially similar to that of the connecting arrays 210 as discussed in FIG. 6. The (i–1)-level modules 406 may be attached to and molded with the i-th ME element 408 to form the IC assembly 400, which includes one or more i-level modules 450. As shown in FIG. 9, the (i–2)-level module 402 may be attached to the i-th ME element 408 by contacts 424 (e.g., solder balls, BVAs, or TSVs). The i-th ME element 408 may include TSVs 426 or BVAs 426. The contact 424 may be coupled to the TSVs 426 or BVAs 426 of the i-th ME element 408. The IC assembly 400 may be diced along the dice lines 412 to form the one or more i-level modules 450.

As shown in FIG. 9, the i-level module 450 may be obtained by sequential stacking of other modules along a Z direction, and the interposer and/or the ME element of each level may be disposed along an X-Y plane. The ME elements and interposers of the i-level module 450 may include one or more TSVs (e.g., TSVs 422 and/or TSVs 426) for providing electrical and/or thermal conduction along the Z direction. The connecting arrays (e.g., connecting arrays 405 or connecting arrays 410) may also provide electrical and/or thermal conduction along the Z direction. In some embodiments, one or more interposer included in the i-level module 450 may include one or more carbon materials, such as graphite, for providing improved thermal conductivity in the X-Y plane.

Figure 10:
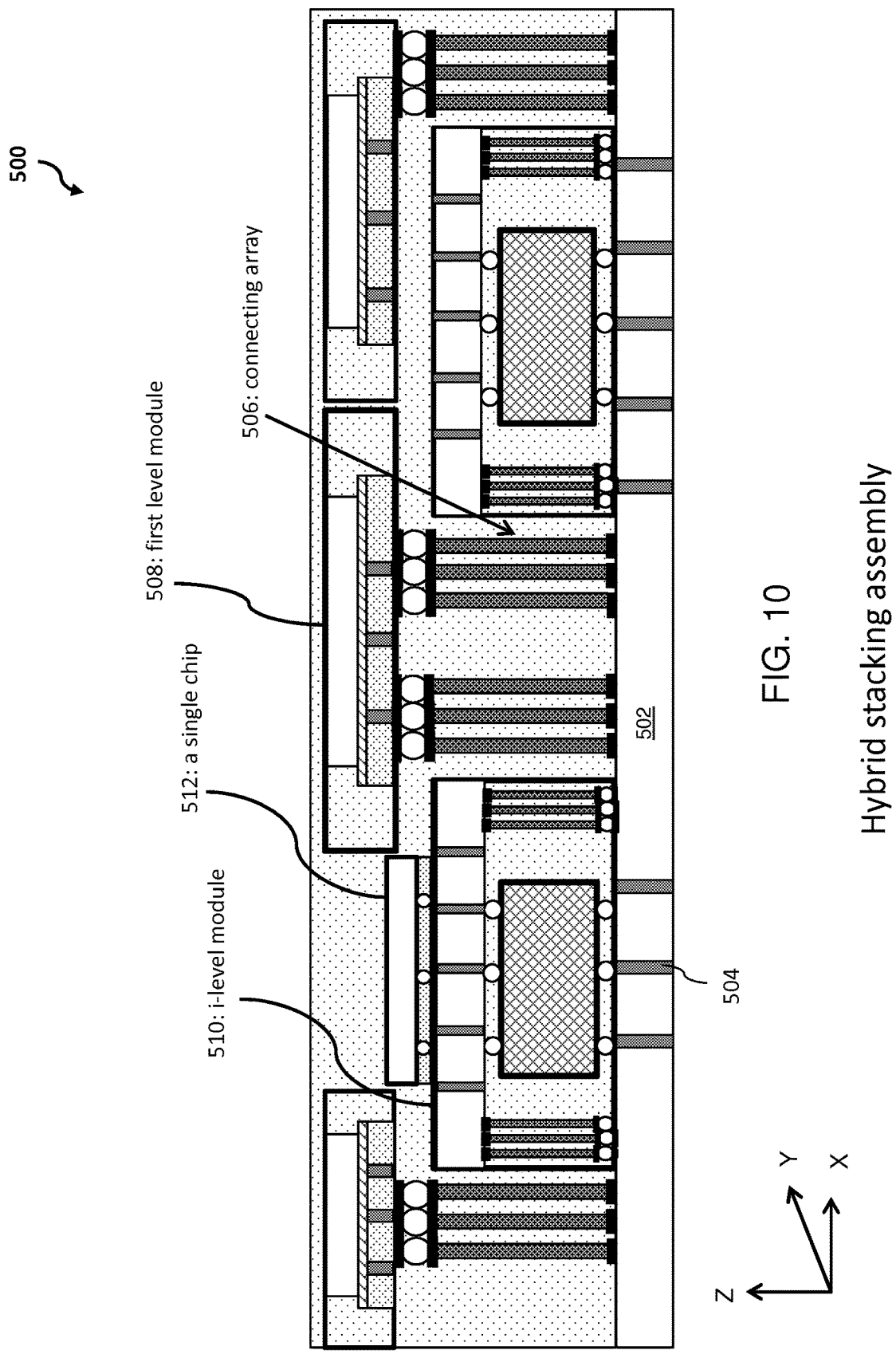
FIG. 10 is a cross-sectional view of an IC packaging structure according to some embodiments of the present disclosure.

FIG. 10 is a cross-sectional view of an IC packaging structure 500 according to some embodiments of the present disclosure. The IC packaging structure 500 may include a hybrid stacking assembly. The IC packaging structure 500 may include an ME element 502, and the ME element 502 may include a chip (or a "die") or wafer having semiconductor integrated circuits that perform any type of functions, e.g. memory, logic, control, and/or other types. The ME element 502 may include a substrate with one or more vias 504. Vias 504 may be either blind vias or through substrate vias (TSVs) fabricated as discussed with regard to TSVs 104 in interposer substrate 102. The vias 504 may provide electrical connection between the circuits above, below, or within the ME element 502. The vias 504 may also provide thermal conduction to transfer heat away from such circuits.

Referring to FIG. 10, one or more connecting arrays 506 are formed on the ME element 502. The formation of the connecting arrays 506 may be substantially similar to that of the connecting arrays 210 as discussed in FIG. 6, for example, the connecting arrays 506 may be BVAs. The BVAs 506 may provide electrical connection between the ME element 502 and one or more other components in IC packaging structure 500. The BVAs 506 may also provide heat conduction away from the ME 502.

Various IC components are attached to the ME element 502 from above or below to form IC packaging structure 500. Thus, first level module 508 or some other type of module may be attached and electrically coupled to some BVAs 506. In some examples, an i-th level module 510 may be attached to the ME element 502, wherein i equals to 1, 2 . . . , or n. The i-th level module 510 may include a number i of ME elements stacked with one or more interposers as discussed with regard to the i-level module 450 in FIG. 9. In some examples, a single chip 512 may also be included in the IC packaging structure 500. The single chip 512 may include a semiconductor integrated circuit configured to perform one or more of a memory function, a logic function, a control function, or other processing function. The single chip 512 may be stacked on an i-level module 510 as shown in FIG. 10. The single chip 512 may also be stacked on any other component of the IC packaging structure 500. The attaching and stacking processes used to fabricate the IC packaging structure 500 may include any suitable packaging technologies. For example, solder balls, contact pads, underfills, and encapsulations may be used to connect and mold various components in the IC packaging structure 500. One or more RDLs may also be included in the IC packaging structure 500.

In a three-dimensional system in FIG. 10, the IC packaging structure 500 may be stacked along a Z direction, and the interposer and/or the ME element of each level may be disposed along an X-Y plane. The TSVs formed along the Z direction in the one or more ME elements and/or interposers may provide electrical conduction and/or thermal conduction along the Z direction in the IC packaging structure 500. The connecting arrays may also provide electrical conduction and/or thermal conduction along the Z direction in the IC packaging structure 500. In some embodiments, one or more interposers may include one or more carbon materials, such as graphite, for providing improved thermal conductivity in the X-Y plane in the IC packaging structure 500.

Figure 11:
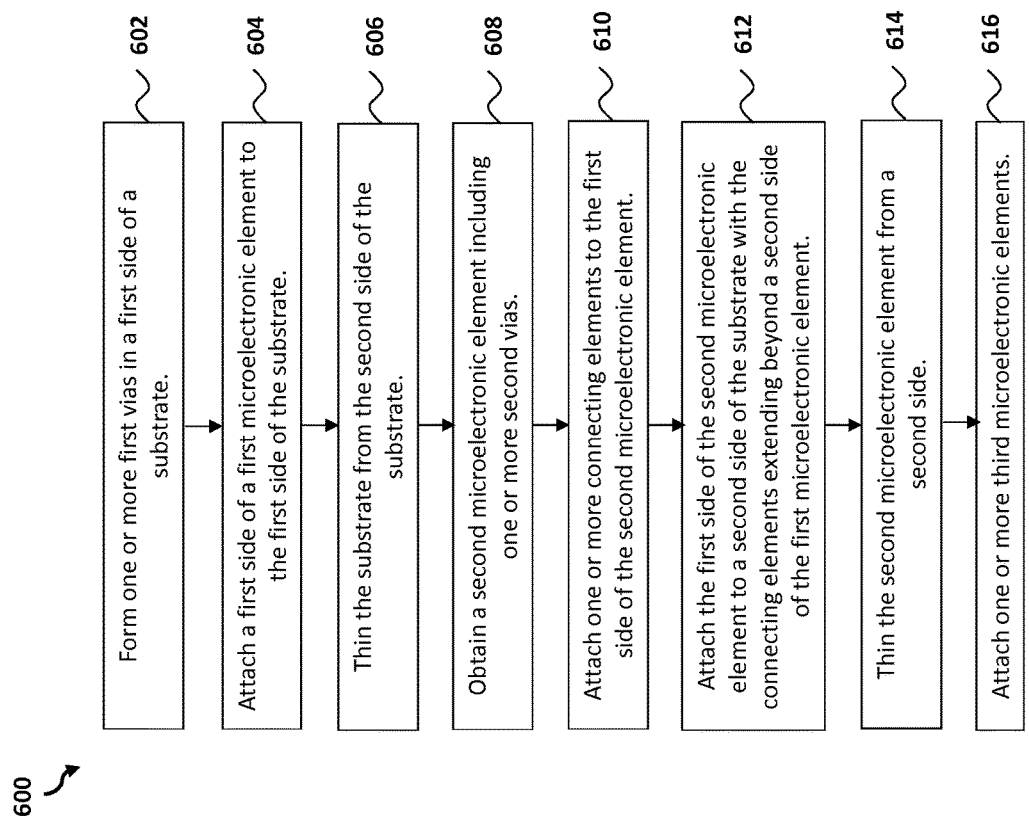
FIG. 11 is a flow chart illustrating a method for IC packaging according to some embodiments of the present disclosure.

FIG. 11 is a flow chart illustrating a method 600 for IC packaging according to some embodiments of the present disclosure. It should be understood that method 600 in the flow chart FIG. 11 is merely exemplary and not meant to be limiting. Any additional processes may be provided before, during, and after the method 600.

The method 600 starts from a process 602 by forming one or more vias (e.g., the vias 104) in a first side (e.g., the first side 112) of a substrate (e.g., the interposer 102). The vias may be "blind vias" terminating inside the substrate. Alternatively, the vias may be through substrate vias (TSVs) extending through the interposer substrate from the first side to the second side (e.g., the second side 114) of the substrate. The vias may be formed by lithography and etching or laser drilling to form holes for the vias, followed by conductor filling of the holes, and back-side thinning of the substrate to reveal the conductor.

The method 600 proceeds to a process 604 of attaching a first side (e.g., the first side 124) of a first microelectronic element (ME) (e.g., the ME element 122) to the first side of the substrate. The vias formed in the substrate may be coupled to the first ME element. One or more contact elements, such as solder balls, may be used to connect the substrate and the first ME element. An underfill can be provided between the substrate and the first ME element, and an encapsulation may be formed by molding to encapsulate the first ME element and possibly the substrate.

The method 600 proceeds to an optional process 606 which thins the substrate from the second side of the substrate. In some embodiments, the buried ends of the "blind vias" may be exposed by the thinning process to form TSVs. The back-side thinning may include wet and/or dry etching (e.g., reactive ion etching RIE), and/or mechanical grinding or lapping or milling and/or chemical mechanical polishing (CMP).

The method 600 proceeds to a process 608 by obtaining a second ME element (e.g., the ME element 202), and the second ME element may include one or more vias (e.g., the vias 207). The vias in the second ME element may include TSVs. Alternatively, the vias in the second ME element may include "blind vias".

The method 600 proceeds to a process 610 by attaching one or more connecting elements (e.g., connecting elements 208/connecting arrays 210) to a first side (e.g., the first side 204) of the second ME element. In some embodiments, each connecting element extends perpendicularly to the second ME element, between its first end (e.g., base) and a second end (e.g., tip). In some embodiments, the connecting element may include conductive materials to provide electrical conduction between the second ME element and the other components. In some embodiments, the connecting element may include carbon materials, such as graphite, for increasing thermal conductivity to transfer heat away from the second ME element. In some embodiments, the one or more connecting elements may be arranged to form connecting arrays. The connecting arrays may be formed at the peripheral areas to surround the first-level modules to be attached on the second ME element.

The method 600 proceeds to a process 612 by attaching the first side of the second ME element to the second side of the substrate. The connecting elements/connecting arrays may extend beyond a second side (e.g., the second side 126) of the first ME element.

The method 600 proceeds to an optional process 614 by performing a thinning process to the second ME element from a second side (e.g., the second side 206) of the second ME element. In some embodiments, the buried ends of the "blind vias" may be exposed after the thinning process to form TSVs in the second ME element. The back-side thinning process may include a wet etching process, a dry etching process (e.g., reactive ion etching RIE), and/or a chemical mechanical polishing (CMP) process.

The method 600 proceeds to a process 616 of attaching one or more third ME elements to the IC connecting elements. The one or more third ME elements may include a single chip, a first level module, and/or a multiple level module stacked together using any suitable packaging technologies. For example, the one or more third ME elements may be attached to the IC packaging structure using one or more contact pads (possibly with solder balls), and underfill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An assembly comprising:
   a first module comprising a plurality of microelectronic elements separated by an interposer; and
   a second module comprising:
      a first microelectronic element attached to a top side of the first module;
      one or more wire bond wires each of which is attached to a bottom side of the first microelectronic element of the second module and extends beyond a top of the first module, the one or more wire bond wires for electrical conduction or thermal conduction; and
      a third module comprising a second microelectronic element underlying the first module and attached to each of the one or more wire bond wires, the first module lying between the first microelectronic element of the second module and the second microelectronic element of the third module.

2. The assembly of claim 1, wherein the first module is attached to the second microelectronic element of the third module.

3. The assembly of claim 1, wherein the one or more wire bond wires are first one or more wire bond wires; and wherein the third module further comprises one or more second wire bond wires each having a first end attached to the second microelectronic element of the third module and each having a second end extending upward beyond the first module and a bottom surface of the first microelectronic element of the second module.

4. An assembly comprising a plurality of modules, each module of the plurality of modules of the assembly comprising:
   an interposer comprising one or more first vias extending through a substrate of the interposer from a first side of the substrate to a second side of the substrate;
   a first microelectronic element having first contacts coupled to the first side of the substrate for electrical conductivity to at least one of the one or more first vias;
   a second microelectronic element coupled to the second side of the substrate through second contacts, the second contacts coupled to an upper surface of the second microelectronic element for electrical conductivity between at least one of the one or more first vias and at least one or more second vias of the second microelectronic element; and
   one or more wire bond wires each having a first end coupled to the upper surface of the second microelectronic element and having a second end opposite the first end corresponding thereto extending past an upper surface of the first microelectronic element, the one or more wire bond wires for electrical conduction or thermal;
   wherein the plurality of modules include a first module and a second module, wherein the second microelectronic element of the second module is attached to the second microelectronic element of the first module.

5. The assembly of claim 4, wherein each of the plurality of modules further comprises:

a third microelectronic element attached to the second end of at least one of the one or more wire bond wires associated with the first microelectronic element; and
a forth microelectronic element attached to the second end of at least one of the one or more wire bond wires associated with the second microelectronic element.

\* \* \* \* \*